(12) United States Patent
Ryan

(10) Patent No.: US 7,504,728 B2
(45) Date of Patent: Mar. 17, 2009

(54) INTEGRATED CIRCUIT HAVING BOND PAD WITH IMPROVED THERMAL AND MECHANICAL PROPERTIES

(75) Inventor: Vivian Ryan, Hampton, NJ (US)

(73) Assignee: Agere Systems Inc., Allentown, PA (US)

( * ) Notice: Subject to any disclaimer, the term of this patent is extended or adjusted under 35 U.S.C. 154(b) by 203 days.

(21) Appl. No.: 11/298,030

(22) Filed: Dec. 9, 2005

(65) Prior Publication Data

US 2007/0134903 A1    Jun. 14, 2007

(51) Int. Cl.
    *H01L 21/31*    (2006.01)
(52) U.S. Cl. .............. 257/764; 257/763; 257/784; 257/E21.519; 257/E23.02; 438/616; 438/617
(58) Field of Classification Search ......... 257/764–762, 257/786–785, E21.519, E23.02; 438/612–618
    See application file for complete search history.

(56) References Cited

U.S. PATENT DOCUMENTS

| | | | |
|---|---|---|---|
| 5,785,236 A | 7/1998 | Cheung et al. | |
| 6,110,816 A | 8/2000 | Huang et al. | |
| 6,153,448 A * | 11/2000 | Takahashi et al. | 438/114 |
| 6,191,023 B1 | 2/2001 | Chen | |
| 6,620,720 B1 | 9/2003 | Moyer et al. | |
| 6,844,631 B2 | 1/2005 | Yong et al. | |
| 6,924,554 B2 | 8/2005 | Gleixner et al. | |
| 2005/0142864 A1 * | 6/2005 | Shim | 438/640 |

* cited by examiner

*Primary Examiner*—Dung A. Le
(74) *Attorney, Agent, or Firm*—Ryan, Mason & Lewis, LLP

(57) ABSTRACT

An integrated circuit includes active circuitry and at least one bond pad. The at least one bond pad, in turn, comprises a metallization layer and a capping layer having one or more grooves. The metallization layer is in electrical contact with at least a portion of the active circuitry. In addition, the capping layer is formed over at least a portion of the metallization layer and is in electrical contact with the metallization layer. The grooves in the capping layer may be located only proximate to the edges of the bond pad or may run throughout the bond pad depending on the application.

20 Claims, 4 Drawing Sheets

INTEGRATED CIRCUIT HAVING BOND PAD WITH IMPROVED THERMAL AND MECHANICAL PROPERTIES

FIELD OF THE INVENTION

This invention is directed to integrated circuits, and more particularly to improving the thermal and mechanical properties of bond pads in integrated circuits.

BACKGROUND OF THE INVENTION

Wire bonding has been used in integrated circuit (IC) packaging since the inception of IC technology. In wire bonding, an electrical connection is established between an IC and an IC package substrate by means of wire connections to the bond pads on the IC. Nevertheless, despite its long history and continual refinement, wire bonding is being replaced to some extent by more advanced packaging technologies. Among the common IC interconnection technologies replacing wire bonding is flip chip bonding. In contrast to wire bonding, flip chip bonding electrically connects an IC to an IC package substrate by means of conductive solder bumps attached to each of the bond pads on the IC. Packaging using flip chip bonding has been shown to offer advantages in size, performance, flexibility, reliability and cost over other packaging technologies, including wire bonding. Despite these advantages, however, wire bonding still accounts for about 90% of today's IC interconnects.

For many kinds of ICs, copper metallization is rapidly replacing aluminum metallization because of copper's low cost and high conductivity when compared to aluminum. This transition has created new issues for both wire bonding and flip chip bonding. Copper is electrochemically active and migrates in an electrical environment. Moreover, copper corrodes to form copper oxide, an insulator, when exposed to ambient moisture and forms undesirable alloys with common materials used in ICs. As a result, conventional wire bonding and flip chip bonding technologies are frequently incompatible with bond pads comprising bare copper.

In response to these issues, copper bond pads are frequently capped in a thin layer of aluminum before they are wire bonded or flip chip bonded. This use of aluminum capping layers is described in, for example, U.S. Pat. No. 5,785,236 entitled "Advanced Copper Interconnect System that is Compatible with Existing IC Wire Bonding Technology," which is incorporated herein by reference. The aluminum capping layer protects the copper surface against corrosion and provides a bondable surface for wires or solder bumps. Even so, this additional aluminum capping layer comes at a significant cost in terms of performance and processing. In terms of performance, the aluminum capping layer degrades thermal conductivity compared to copper. This means that the rate of heat dissipation from the IC to the IC package is lessened, thereby resulting in either decreased IC performance and reliability or the need to upgrade to a more expensive package. With respect to processing, aluminum capping layers on copper are also susceptible to delamination, especially at the corners of the bond pads. Such delamination can have a catastrophic effect on IC manufacturing yield. Moreover, attempts to correct this corner delamination by modifying the shape of the bond pads from a square or rectangle into, for example, an octagon shape may further degrade thermal conductivity. Bond pads that are not square or rectangular will also tend to create issues with the pattern recognition systems on typical assembly and probe equipment.

For the aforementioned reasons, there is a need for apparatus and methods which improve the delamination resistance and thermal conductivity of bond pads, especially those comprising an aluminum capping layer on a copper metallization layer.

SUMMARY OF THE INVENTION

The present invention addresses the above-identified need by providing apparatus and methods for improving the delamination resistance and thermal conductivity of bond pads comprising a capping layer on a metallization layer. Illustrative embodiments in accordance with aspects of the invention achieve this in part by patterning the capping layer such that it comprises one or more grooves.

In accordance with an aspect of the invention, an IC includes active circuitry and at least one bond pad. The at least one bond pad, in turn, comprises a metallization layer and a capping layer. The metallization layer is in electrical contact with at least a portion of the active circuitry. In addition, the capping layer is formed over at least a portion of the metallization layer and is in electrical contact with the metallization layer. Advantages of the invention are achieved, at least in part, by patterning the capping layer such that it comprises one or more grooves.

In accordance with another aspect of the invention, the IC described above is mounted in an IC package. The IC package may, for example, be one based on wire bonding or flip chip bonding technologies.

In an illustrative embodiment, a bond pad comprises an aluminum capping layer and a tantalum nitride barrier layer formed on a copper metallization layer. A series of parallel grooves are formed across the capping layer with a depth of about 40-60% of the capping layer thickness. During IC packaging, wires or solder bumps are formed on the modified capping layer. Advantageously, the grooves in the capping layer reduce the chance that the capping layer will delaminate. Moreover, thermal conduction from the IC into the wires/solder bumps and any encapsulating materials is also enhanced.

DETAILED DESCRIPTION OF THE INVENTION

This invention will be illustrated herein in conjunction with exemplary bond pads for use in ICs. It should be understood, however, that the invention is not limited to the particular materials, film layers and processing steps shown and described herein. Modifications to the illustrative embodiments will become apparent to those skilled in the art.

It should also be understood that the various layers and/or regions shown in the accompanying figures are not drawn to scale, and that one or more semiconductor layers and/or regions of a type commonly used in such ICs may not be explicitly shown in a given figure for ease of explanation. This does not imply that the semiconductor layers and/or regions not explicitly shown are omitted from the actual IC.

Particularly with respect to processing steps, it is emphasized that the descriptions provided herein are not intended to encompass all of the processing steps which may be required to successfully form a functional device. Rather, certain processing steps which are conventionally used in forming IC devices, such as, for example, wet cleaning and annealing steps, are purposefully not described herein for economy of description. However one skilled in the art will readily recognize those processing steps omitted from this generalized description. Moreover, details of the process steps used to fabricate such semiconductor devices may be found in a number of publications, for example, S. Wolf and R. N. Tauber, *Silicon Processing for the VLSI Era, Volume* 1, Lattice Press, 1986 and S. M. Sze, *VLSI Technology, Second Edition*, McGraw-Hill, 1988, both of which are incorporated herein by reference.

The vertical direction is defined herein as the direction substantially perpendicular to a plane comprising a surface of the semiconductor substrate contained within the IC. Correspondingly, the lateral direction is defined as a direction substantially parallel to a plane comprising a surface of the semiconductor substrate.

Figure 1A:
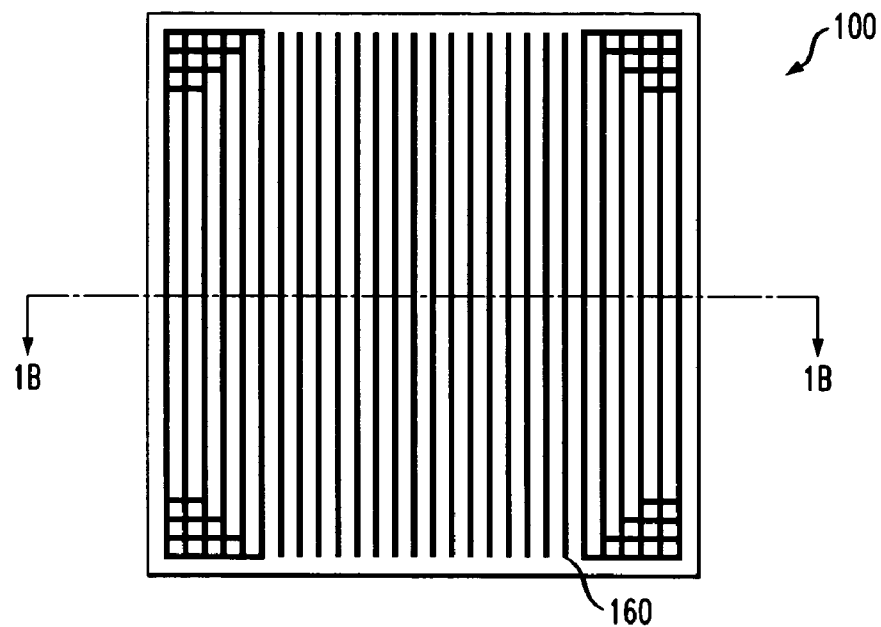
FIG. 1A shows a plan view of a bond pad in accordance with a first illustrative embodiment of the invention.

FIG. 1A shows a simplified plan view of a bond pad 100 in accordance with a first illustrative embodiment of the invention. In this figure, it can be observed that the bond pad is roughly square. However this shape is used for ease of illustration and any other bond pad shape will still fall within the scope of this invention. The bond pad could, for example, be rectangular. A rectangular bond pad may be advantageous over a square bond pad because a rectangular bond pad may allow greater room for lateral misalignment and skidding during the bonding process.

Figure 1B:
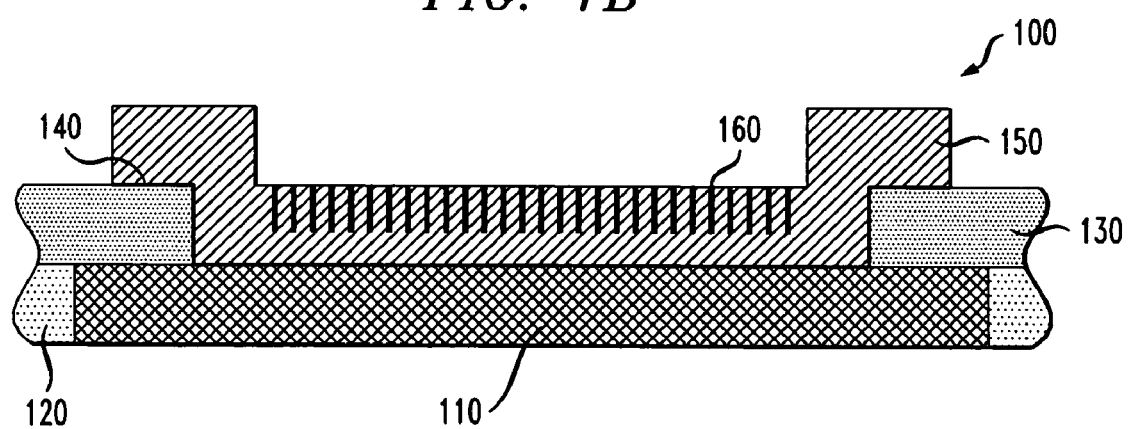
FIG. 1B shows a sectional view of the FIG. 1A embodiment.

Correspondingly, FIG. 1B shows a sectional view of the patterned features that combine to form the illustrative bond pad 100. The lowermost feature can be seen to comprise a metallization layer 110 surrounded laterally by an interlevel dielectric (ILD) layer 120. Moving upward in direction, a passivation layer 130 defines a window over the metallization layer. A barrier layer 140 and a capping layer 150 lie conformally over this window and the underlying metallization layer.

In accordance with an aspect of the invention, the metallization layer 110 in the illustrative embodiment shown in FIGS. 1A and 1B comprises copper. Copper, as mentioned before, is an attractive candidate as an interconnection material because of its low cost and high conductivity when compared to aluminum. Use of copper in the metallization levels, especially when combined with an ILD formed of a dielectric material having a low dielectric constant, may substantially reduce the resistance-capacitance-induced time delays for electrical signals traveling in the metallization levels. IC performance is thereby enhanced.

In accordance with another aspect of the invention, the capping layer 150 comprises aluminum. The capping layer will preferably have a thickness between about 500 and 2,500 nanometers (nm). This aluminum capping layer both protects the copper metallization layer 110 against corrosion and provides a bondable surface for subsequent wires or solder bumps.

The barrier layer 140 is formed between the metallization layer 110 and the capping layer 150. The composition of the barrier layer is preferably chosen to both restrict interdiffusion between the capping and metallization layer materials as well as enhance adhesion of the capping layer to the metallization layer and passivation layer 130. If the capping layer comprises aluminum and the metallization layer comprises copper, the barrier layer will preferably comprise a material such as, but not limited to, tantalum or tantalum nitride. The thickness of such a barrier layer is preferably between about 25 and 50 nm.

Conventional aspects of the formation of the illustrative bond pad 100 shown in FIGS. 1A and 1B will be familiar to one skilled in the semiconductor processing art. Briefly, the copper metallization layer 110 is preferably formed by a Damascene process sequence. In this process sequence, the ILD layer 120 is first deposited. Subsequently a trench is formed in the ILD layer in the desired shape of the metallization layer feature by use of standard photolithography and reactive ion etching (RIE) techniques. After stripping the photolithographic mask, copper is then conformally deposited in this trench, preferably by either chemical vapor deposition (CVD) or electroplating. Chemical mechanical polishing is then used to remove the excess copper from the top of the ILD layer.

Next, the passivation layer 130 is deposited on the metallization layer 110. A window exposing a portion of the underlying metallization layer is then formed in the passivation layer by photolithography and RIE, this time in the shape of the desired capping layer feature. Subsequently, the barrier layer 140 (e.g., tantalum or tantalum nitride) and the aluminum capping layer 150 are deposited conformally onto the window feature. The barrier layer and aluminum capping layer are preferably deposited by evaporation, sputter deposition or CVD. Photolithography and RIE steps are then used to pattern the barrier and capping layers to form discrete pads on the surface of the IC.

In accordance with yet another aspect of the invention, one or more grooves, collectively represented in FIGS. 1A and 1B by groove 160, are formed in the capping layer 150. The formation of the grooves will preferably be achieved by standard photolithography and RIE steps. Advantageously, due to the relatively large size of the groove features and their function in this application, the tolerance for variations in groove widths and depths is relatively high when compared to other semiconductor patterning steps. Consequently, the formation of the grooves may be achieved relatively inexpensively when compared to other patterning steps that require greater precision.

Patterning grooves into the capping layer 150 in accordance with aspects of the invention will generate numerous benefits. Due to its composition, placement and function, the capping layer may be subjected to many forms of stress. For example, the capping layer may undergo tensile or compressive stresses due to differences in the thermal expansion coefficients between the capping layer and the underlying layers. Moreover, the capping layer may be subjected to compressive stresses during bonding and shear stresses after the wires or solder bumps are attached. One or a combination of these stresses, and many others, may cause the capping layer to delaminate. The corners of the capping layer are the most susceptible to this delamination. Once delamination occurs, yield for the processing will be negatively impacted as bond pads become unusable, electrical connections detach, and particles contaminate process tooling and test equipment.

Forming grooves in the capping layer 150 like those shown in FIG. 1A, for example, will relieve some of these stresses. The grooves will preferably be 350 to 1,500 nm in width. The spacing between grooves will preferably be equal to the width of the associated grooves. In addition, the grooves will preferably be formed such that they are about 40-60% of the depth of the capping layer 140. These dimensions have been experimentally determined to provide the best combination of stress relief while at the same time not degrading other characteristics of the bond pad. For example, grooves with these dimensions will allow the capping layer to maintain strength with respect to normal and shear forces, allow good wire or solder bump bonding, and resist crack propagation during processing. However, other depths and other groove dimensions may be used in alternative embodiments.

Figure 2:
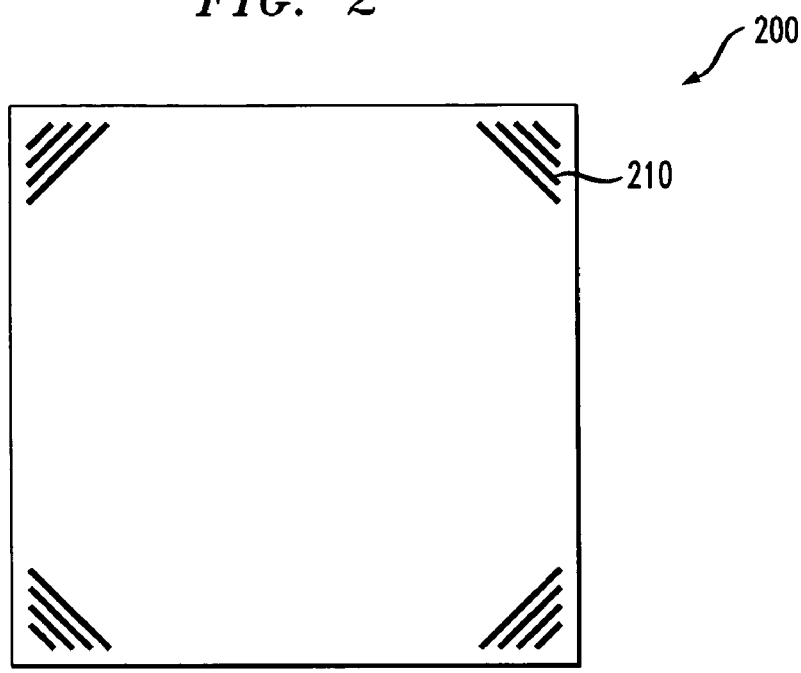
FIG. 2 shows a plan view of a bond pad in accordance with a second illustrative embodiment of the invention.
Figure 3:
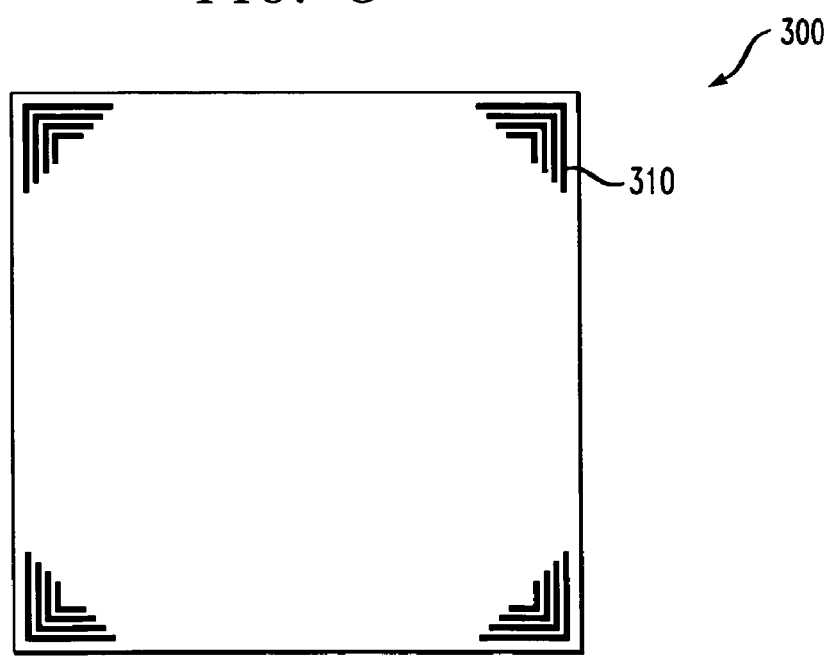
FIG. 3 shows a plan view of a bond pad in accordance with a third illustrative embodiment of the invention.

The bond pad 100 in FIG. 1A comprises grooves 160 that extend across the majority of the area of the bond pad. Most of the grooves run parallel to one another and substantially from one edge of the bond pad to the opposite edge. Moreover, additional grooves are formed perpendicular to the others near the corners of the bond pad where delamination is most probable to occur. However, the pattern of grooves shown in FIG. 1A is only one such pattern and numerous other arrangements will come within the scope of this invention. FIGS. 2 and 3, for example, show illustrative bond pads 200 and 300, respectively, with different groove patterns. In each of these bond pads, grooves, collectively represented by grooves 210 and 310, respectively, are formed substantially proximate to one or more corners of the bond pads. In FIG. 2, the grooves run substantially at a 45 degree angle relative to the edges of the bond pad. In FIG. 3, the grooves run substantially perpendicular to one or more edges of the bond pad.

Grooves formed in the capping layer 150 also improve thermal dissipation from the IC. Since heat dissipation from an IC is intimately coupled to its IC package, the dynamics of this improvement will now be described with respect to wire bonding and flip chip bonding packaging technologies. These packaging technologies will be familiar to one skilled in the art and are also described in detail in, for example, G. R. Blackwell, *The Electronic Packaging Handbook*, CRC Press, 1999, which is incorporated herein by reference. It should be noted however, that, as stated earlier, the scope of this invention is not limited to those particular packaging technologies presented herein, and other applications of the invention will be evident to one skilled in the art.

Figure 4:
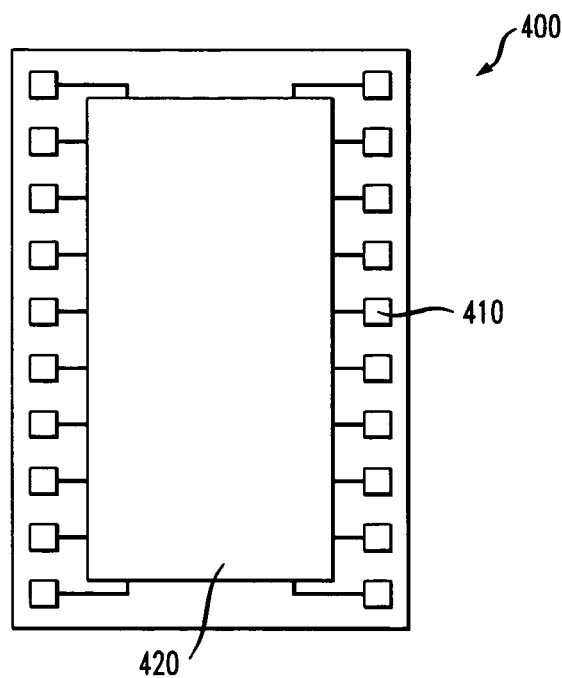
FIG. 4 shows a plan view of an illustrative IC.

For wire bonding applications, the bond pads on the IC are typically located near the periphery of the IC. Thin wires are then spanned from the bond pads to the lead frame or substrate of the IC package. FIG. 4 shows an illustrative IC 400 in a configuration conducive to wire bonding. In the IC, a plurality of bond pads, represented collectively by bond pad 410, are arranged in proximity to the edges of the IC. These bond pads are, in turn, connected to active circuitry 420. The connections between the bond pads and the active circuitry occur through various levels of metallization.

The actual bond between the fine diameter wires and the IC bond pads is typically formed using one of two wire bond processes, both of which will be familiar to one skilled in the art. In ball bonding, a ball is first formed at the end of a wire, the wire typically comprising gold. The ball is then brought in contact with the bond pad. Adequate amounts of pressure, heat and/or ultrasonic energy are then applied to the ball for a specific amount of time forming a metallurgical weld between the ball and the bond pad. In wedge bonding, a clamped wire, typically comprising aluminum, is brought in contact with the bond pad. Ultrasonic energy is then applied to the wire for a specific duration while the wedge is held down by a specific amount of force. A weld is thereby formed between the wire and bond pad.

Figure 5:
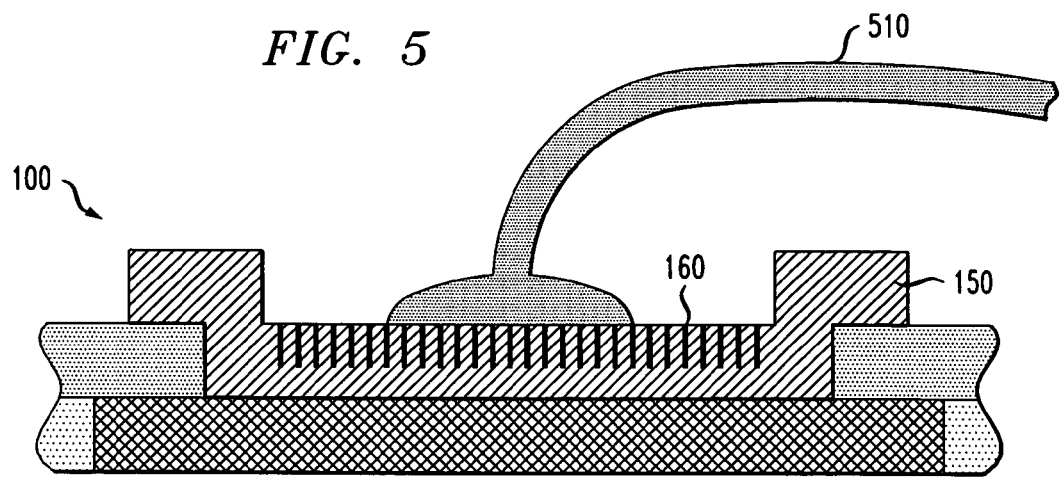
FIG. 5 shows a sectional view of the FIG. 1A embodiment in a wire bonding configuration.

FIG. 5 shows a sectional view of the FIG. 1A bond pad 100 with a wire 510 ball bonded to the capping layer 150. Importantly, the wire bonding material not only bonds to the surface of the capping layer, but may also deposit in the grooves 160 in the capping layer. This filling will generate at least three advantageous effects. First, the volume of the capping layer through which the heat generated by the IC must travel before entering the wire bond is reduced. Since, as is typically the case, the capping layer is formed of aluminum which has a substantially lower thermal conductivity than copper, the reduced volume of aluminum helps to speed thermal dissipation from the IC. Second, the filling of the grooves enhances the surface area between the wire and the bond pad. This too is advantageous to the conduction of thermal energy from one structure to the other. Finally, entirely separate from any aspects of thermal conduction, the filling of the grooves enhances the strength of the bond between the wire and the bond pad. The possibility of disconnection of the wire from the bond pad under various thermal and mechanical stresses is thereby also advantageously reduced.

Figure 6:
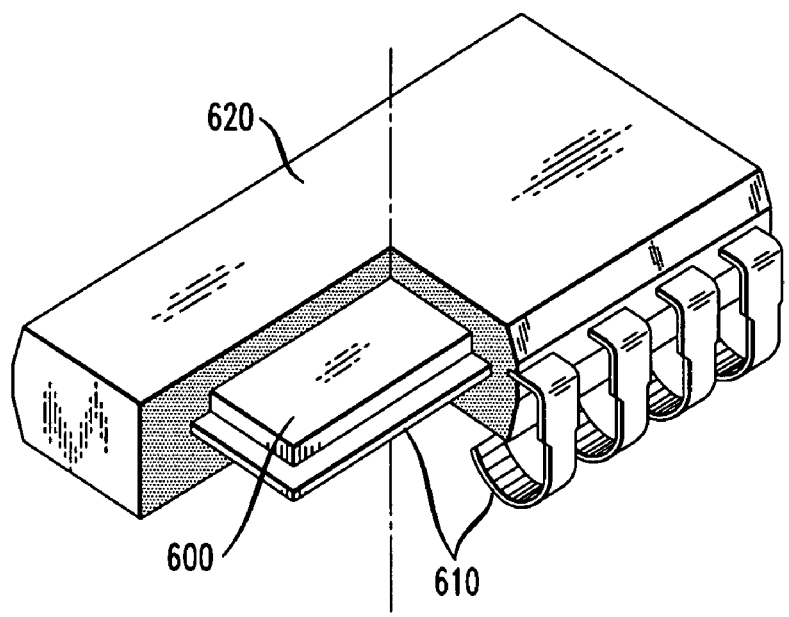
FIG. 6 shows a perspective view of an illustrative IC mounted in an IC package that is partially broken away.

In addition, the wire bonded IC in some packaging technologies may be encapsulated in molding compound comprising, for example, plastic. Fillers like crystalline silicon dioxide are frequently used to improve the thermal conductivity of this material. If present, this molding compound may also at least partially fill the grooves 160 in bond pad 100, thereby improving thermal dissipation from the IC to the IC package. FIG. 6, for example, shows an illustrative IC 600 packaged in a plastic-encapsulated IC package. The IC is electrically and thermally connected to a metallic lead frame 610. A plastic molding compound 620, partially broken away in the figure, encapsulates the IC and a portion of the lead frame.

Figure 7:
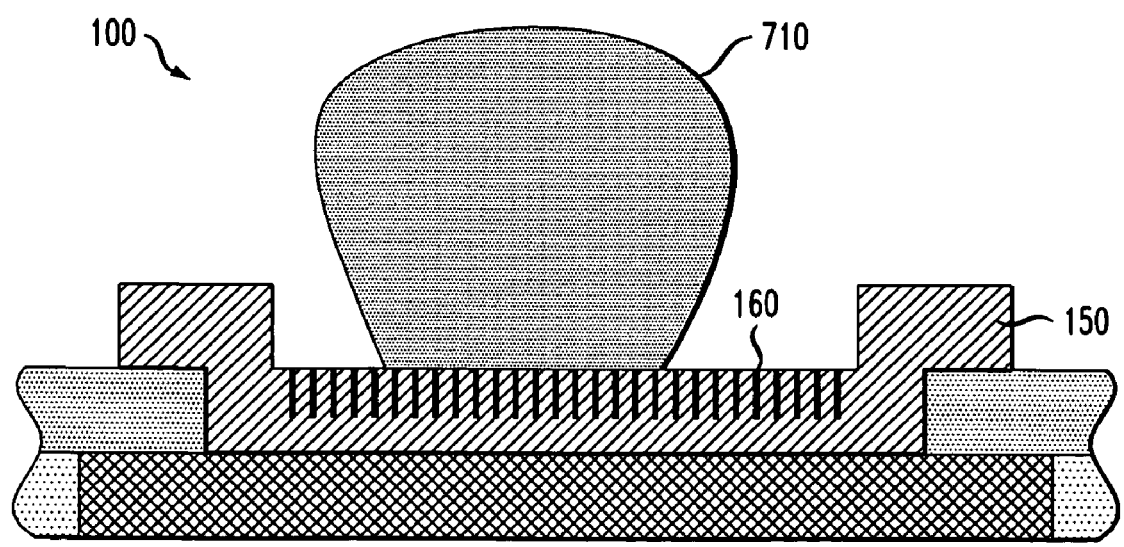
FIG. 7 shows a sectional view of the FIG. 1A embodiment in a flip chip bonding configuration.

FIG. 7, in contrast, shows a sectional view of the FIG. 1A bond pad 100 in a flip chip bonding configuration. Typically, in flip chip bonding, a solder bump is first attached to the bond pads on the IC. The solder bumps may be formed or placed on the bond pad in many ways, including, but not limited to, evaporation, electroplating, printing, jetting, stud bumping, and direct placement. The solder typically will comprise an alloy of tin and lead. Once in place, the IC and the attached solder bumps are typically flipped onto an IC package substrate that has connectors matching the placement of the solder bumps. Once aligned, the solder bumps are melted forming an electrical and thermal connection between the IC and the IC package substrate. Heat may be provided by a furnace, hot gas or other local means.

Referring to FIG. 7, it can be seen that solder bump 710 has been formed on the surface of the capping layer 150. Like in the case of wire bonding, some portion of the solder bump may form inside the grooves 160 in the capping layer. These filled grooves will, for the same reasons detailed above, enhance both the thermal dissipation from the IC into the IC package through the solder bump as well as the adhesion of the solder bump to the bond pad. Numerous advantages are thereby also achieved in flip chip packaging by use of apparatus and methods in accordance with aspects of this invention.

In addition, after the solder bumps are utilized to connect the IC to the IC package, an underfill material is frequently filled between the IC and the IC package substrate. The underfill protects the solder bumps from moisture or other environmental hazards, provides additional mechanical strength to the assembly, and improves heat dissipation from the IC to the IC package. The underfill material is typically epoxy-based. Like the molding compound in wire bonding, this underfill material may also fill in the exposed grooves 160 in the bond pad 100, thereby further enhancing thermal dissipation from the IC to the IC package.

It should be noted that forming of grooves in the bond pads need not be implemented on every bond pad within an IC but may, for example, be implemented on only those bond pads located in what is known to be a thermally hostile region of the IC package. Moreover, it should be further noted that aspects of this invention may be implemented in what are commonly referred to as "extended" bond pads and still come within the scope of this invention. Extended bond pads are described in, for example, U.S. Pat. No. 6,844,631 entitled "Semiconductor Device Having a Bond Pad and Method Therefore," which is incorporated herein by reference. An extended bond pad is an IC bond pad that is elongated so that is has two distinct non-overlapping regions: a region for probe testing during IC manufacturing, and a region for wire bonding or flip chip bonding during packaging. The separate regions for probe testing prevent the bonding portions of the extended bond pads from being damaged by probe needles. Additionally, an extended bond pad advantageously provides a greater area of exposed metal for heat dissipation from the IC in the IC package.

It should also be emphasized that, although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. An integrated circuit including active circuitry and at least one bond pad, the at least one bond pad comprising:
   a metallization layer, the metallization layer in electrical contact with at least a portion of the active circuitry; and
   a capping layer, the capping layer formed over at least a portion of the metallization layer and in electrical contact with the metallization layer;
   wherein the capping layer is patterned to comprise a plurality of etched grooves;
   wherein one or more of said etched grooves are formed in an upper surface of the capping layer but do not extend through the capping layer to a lower surface of the capping layer;
   at least one of said etched grooves thereby having a depth which is less than a thickness of the capping layer between said upper and lower surfaces.

2. The integrated circuit of claim 1, wherein the metallization layer comprises copper.

3. The integrated circuit of claim 1, wherein the capping layer comprises aluminum.

4. The integrated circuit of claim 1, further comprising a passivation layer, the passivation layer defining an opening over the metallization layer through which the capping layer electrically contacts the metallization layer.

5. The integrated circuit of claim 1, wherein the capping layer has a thickness between about 500 and 2,500 nanometers.

6. The integrated circuit of claim 1, wherein at least one of the etched grooves in the capping layer has a width between about 350 and 1,500 nanometers.

7. The integrated circuit of claim 1, wherein the depth of at least one of the etched grooves in the capping layer is about 40 to 60% of the thickness of the capping layer.

8. The integrated circuit of claim 1, wherein the capping layer comprises a plurality of etched grooves that run parallel relative to one another.

9. The integrated circuit of claim 1, wherein the capping layer in the plane parallel to a surface of the capping layer is substantially square or substantially rectangular.

10. The integrated circuit of claim 1, wherein at least one of the etched grooves in the capping layer is located substantially proximate to one or more corners of the capping layer.

11. The integrated circuit of claim 1, wherein at least one of the etched grooves in the capping layer runs substantially perpendicular to one or more edges of the capping layer.

12. The integrated circuit of claim 1, wherein at least one of the etched grooves in the capping layer runs substantially at a 45 degree angle relative to one or more edges of the capping layer.

13. The integrated circuit of claim 1, wherein the bond pad further comprises a barrier layer, the barrier layer lying between the metallization layer and the capping layer.

14. The integrated circuit of claim 13, wherein the barrier layer comprises tantalum.

15. The integrated circuit of claim 1, wherein at least one of the one or more bond pads is an extended bond pad.

16. An integrated circuit including active circuitry and at least one bond pad, the at least one bond pad comprising:
   a metallization layer, the metallization layer in electrical contact with at least a portion of the active circuitry;
   a capping layer, the capping layer formed over at least a portion of the metallization layer and in electrical contact with the metallization layer; and
   a passivation layer, the passivation layer defining an opening over the metallization layer through which the capping layer electrically contacts the metallization layer;
   wherein the capping layer is patterned to comprise a plurality of etched grooves; and
   wherein the capping layer lies at least partially on top of the passivation layer.

17. An integrated circuit mounted in an integrated circuit package, the integrated circuit including active circuitry and a bond pad, wherein the bond pad comprises:
   a metallization layer, the metallization layer in electrical contact with at least a portion of the active circuitry; and
   a capping layer, the capping layer formed over at least a portion of the metallization layer and in electrical contact with the metallization layer;
   wherein the capping layer is patterned to comprise a plurality of etched grooves;
   wherein one or more of said etched grooves are formed in an upper surface of the capping layer but do not extend through the capping layer to a lower surface of the capping layer;
   at least one of said etched grooves thereby having a depth which is less than a thickness of the capping layer between said upper and lower surfaces.

18. The integrated circuit of claim 17, wherein the integrated circuit package is electrically coupled to the integrated circuit using wire bonding technology.

19. The integrated circuit of claim 17, wherein the integrated circuit package is electrically coupled to the integrated circuit using flip chip bonding technology.

20. A method of forming a bond pad in an integrated circuit including active circuitry, the method comprising the steps of:
   forming a metallization layer, the metallization layer in electrical contact with at least a portion of the active circuitry; and
   forming a capping layer over at least a portion of the metallization layer and in electrical contact with the metallization layer;
   wherein the capping layer is patterned to comprise a plurality of etched grooves;
   wherein one or more of said etched grooves are formed in an upper surface of the capping layer but do not extend through the capping layer to a lower surface of the capping layer;
   at least one of said etched grooves thereby having a depth which is less than a thickness of the capping layer between said upper and lower surfaces.

* * * * *